United States Patent [19]

Linn

[11] Patent Number: 5,391,940

[45] Date of Patent: Feb. 21, 1995

[54] PAD DRIVER CIRCUIT WITH POWERED DOWN DEVICE PROTECTION

[75] Inventor: Scott A. Linn, Corvallis, Oreg.

[73] Assignee: Hewlett-Packard Corporation, Palo Alto, Calif.

[21] Appl. No.: 140,347

[22] Filed: Oct. 20, 1993

[51] Int. Cl.[6] .............................................. H03K 17/16
[52] U.S. Cl. ..................................... 326/21; 361/88; 326/83; 326/121; 327/546
[58] Field of Search ............. 307/443, 451, 475, 296.4, 307/296.5; 361/88, 91; 364/235

[56] References Cited

U.S. PATENT DOCUMENTS

| | | | |
|---|---|---|---|
| 4,047,233 | 9/1977 | Yorks et al. | 361/88 |
| 4,441,035 | 4/1984 | Demetrion | 307/296.5 |
| 4,827,149 | 5/1989 | Yabe | 361/88 X |
| 4,945,264 | 7/1990 | Lee et al. | 307/443 X |
| 4,964,011 | 10/1990 | Sternglass | 361/88 |
| 5,101,119 | 3/1992 | Yoshimori et al. | 307/475 X |
| 5,216,674 | 6/1993 | Peter et al. | 361/88 X |
| 5,281,869 | 1/1994 | Lundberg | 307/451 X |
| 5,304,872 | 4/1994 | Avraham et al. | 307/475 |

Primary Examiner—David R. Hudspeth

[57] ABSTRACT

A first electronic device, such as a computer, is connected to a second electronic device, such as a printer, over a communication bus. The second electronic device has device specific integrated circuitry for performing the functions of the device, and also has pad driver circuitry. The pad driver circuitry is connected between the communication bus and the device specific integrated circuitry. The first electronic device is powered by a first voltage source, such as AC power through an on/off switch. The second electronic device is powered by a second voltage source, such as AC power through a different on/off switch. In addition to being powered by the second voltage source, the pad driver circuitry is also powered by a third voltage source, isolated from the second voltage source. When the pad driver circuitry in the second device detects that the first device is powered-on and the second device is powered-off, it assures that the device specific circuitry in the second device will not become inadvertently powered-on by the first device through the communications bus. Pad driver circuitry also assures that power from the first device through a data line on the communications bus is not inadvertently fed back to the first device through a different data line on the communications bus. Pad driver circuitry also assures that current from the first device is not sunk (i.e. finds a path to ground) through the pad driver circuitry.

7 Claims, 4 Drawing Sheets

5,391,940

PAD DRIVER CIRCUIT WITH POWERED DOWN DEVICE PROTECTION

FIELD OF THE INVENTION

This invention relates to the electronics circuitry field. More particularly, this invention is a pad driver circuit with powered down device protection.

BACKGROUND OF THE INVENTION

Traditional electronic devices of the past, from toasters to television sets, performed a variety of functions, but normally had one thing in common—they didn't connect to any other electronic device.

Today's electronic devices are decidedly more complex. An increasing number of electronic devices today are interconnected to one or more other electronic devices. For example, personal computers are often connected to printers, tape drives, modems, etc., and communicate with these devices over a communications cable. This interconnectability of electronic devices has vastly expanded the function and power of electronic devices in general, but is not without its problems. One such problem caused by the interconnectability of electronic devices occurs when one device is powered-on while the other device is powered-off. This situation is commonly encountered when a powered-on computer is connected to a powered-off printer. When this situation occurs, the printer can be inadvertently powered-on through the communications cable. This can result in a variety of unpredictable and undesirable events occurring. One such undesirable event is the illumination of status lights and the false indication to a user that the printer is on and operational when it in fact is off. Other such undesirable events are more catastrophic—the burnout and failure of one or more components in the printer, or even in the computer itself—if power is fed back to the computer through another data line on the communications bus.

Previous attempts to solve the above problem have been wholly unsuccessful. Often the problem is simply ignored, with the blind hope that the powered-on device and the powered-off device can handle the situation without failing or giving an incorrect status indication to a user.

SUMMARY OF THE INVENTION

It is a primary object of the invention to provide an enhanced pad driver circuit.

It is another object of the invention to provide a pad driver circuit with powered down device protection.

These and other objects of the invention are accomplished by the pad driver circuit with powered down device protection disclosed herein.

A first electronic device, such as a computer, is connected to a second electronic device, such as a printer, over a communication bus. The second electronic device has device specific integrated circuitry for performing the functions of the device, and also has pad driver circuitry. The pad driver circuitry is connected between the communication bus and the device specific integrated circuitry. The first electronic device is powered by a first voltage source, such as AC power through an on/off switch. The second electronic device is powered by a second voltage source, such as AC power through a different on/off switch. In addition to being powered by the second voltage source, the pad driver circuitry is also powered by a third voltage source, isolated from the second voltage source. When the pad driver circuitry in the second device detects that the first device is powered-on and the second device is powered-off, it assures that the device specific circuitry in the second device will not become inadvertently powered-on by the first device through the communications bus. Pad driver circuitry also assures that power from the first device through a data line on the communications bus is not inadvertently fed back to the first device through a different data line on the communications bus. Pad driver circuitry also assures that current from the first device is not sunk (i.e. finds a path to ground) through pad driver circuitry.

DETAILED DESCRIPTION OF THE PREFERRED EMBODIMENT

Figure 1:
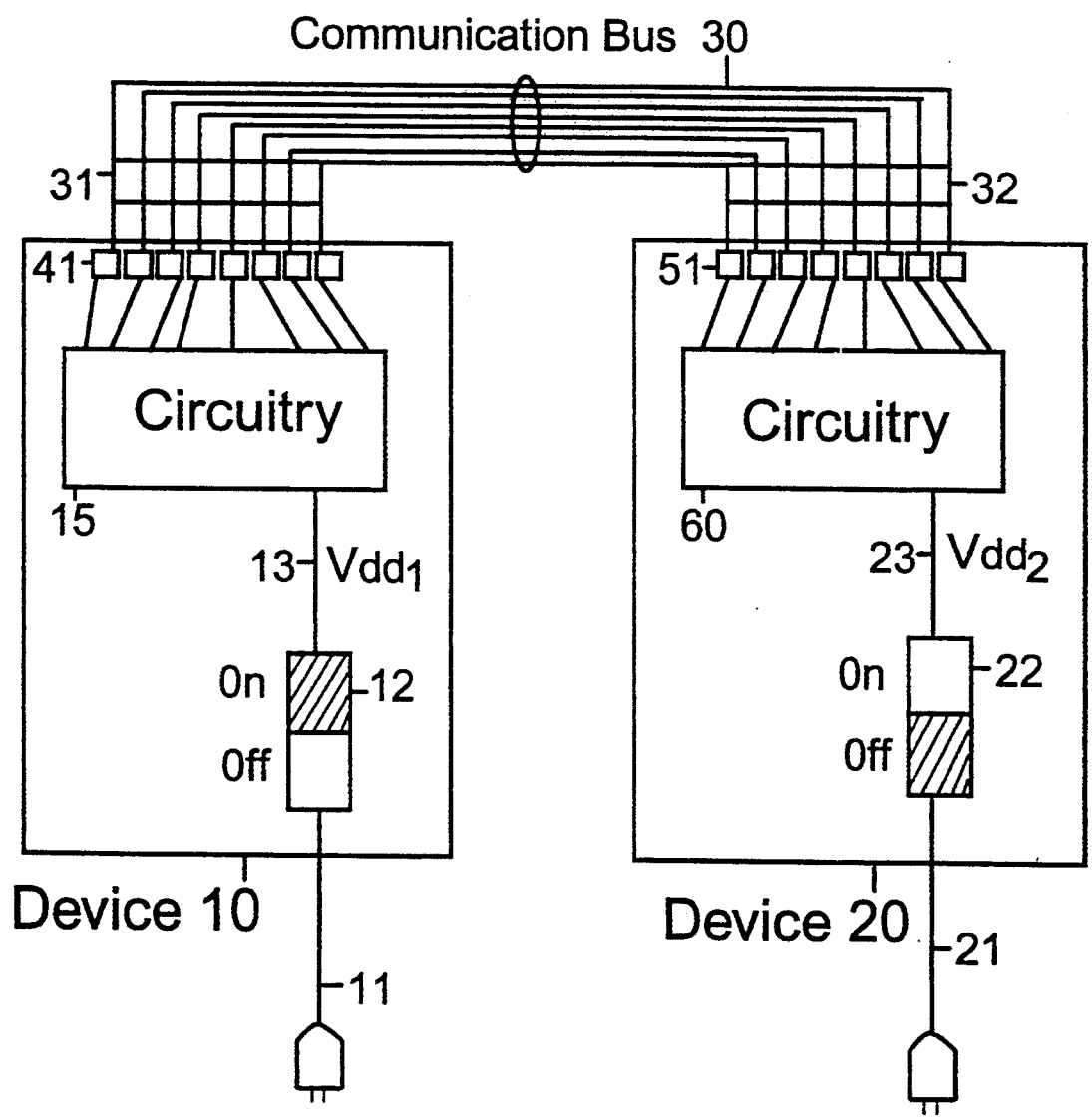
FIG. 1 shows two electronic devices connected together over a communications bus.

FIG. 1 shows two electronic devices connected together over a communications bus. Device 10 has circuitry 15, which receives power from AC power line 11 through switch 12. Voltage is present on line 13 when switch 12 is on, and is not present when switch 12 is off. The voltage on line 13 shall be referred to as Vdd1, and is normally stepped down by a transformer (not shown) and rectified by a rectifier (not shown) to a relatively small DC voltage (i.e. 5 VDC) to control circuitry 15. Circuitry 15 in turn is connected to a series of pads 41–48, which are connected via connector 31 to the data lines that form communications bus 30. Communications bus 30 is connected to pads 51–58 on device 20 via connector 32. Pads 51–58 are connected to circuitry 60, which in turn is powered by the voltage present on line 23 (Vdd2) via switch 22, a rectifier (not shown) and transformer (not shown), and AC power line 21.

In the preferred embodiment, device 10 is a personal computer and device 20 is a printer, although these devices could be any electronic devices interconnected via a communications bus. In addition, power lines 11 and/or 21 could be connected to a low voltage battery or other voltage source, such as photovoltaic cells, solar battery, etc., and still fall within the spirit and scope of the invention.

The problem discussed above occurs when device 10 is powered-on (Vdd1=5V), and device 20 is powered-off (Vdd2=0). If one or more pads 41–48 on device 10 contain a logical "1" (i.e. 5V) on them, this logical "1" will be provided to its corresponding pad 51–58 on device 20 via communications line 30, perhaps resulting in device 20 becoming inadvertently powered-on, and/or device 20 inadvertently feeding back power from device 10 through a different data line on communications bus 30.

Figure 2:
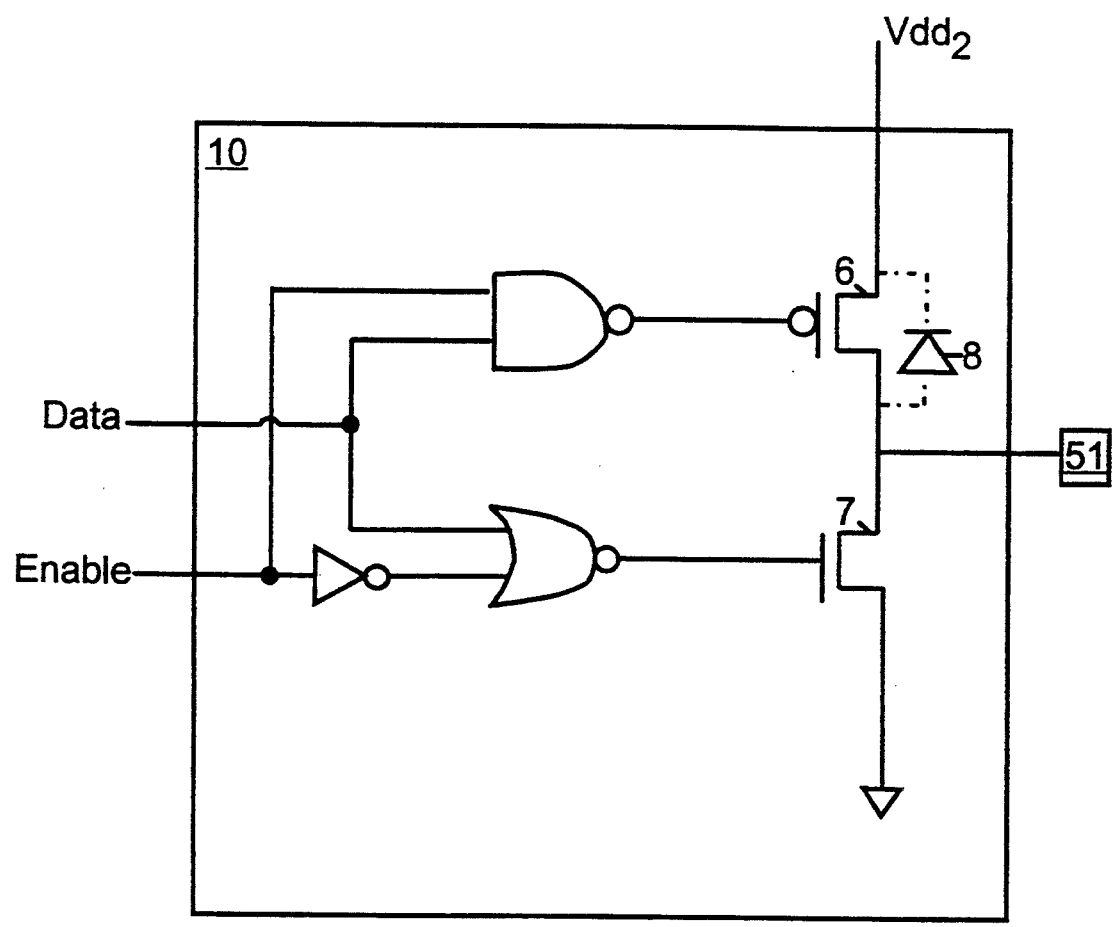
FIG. 2 shows a prior art pad driver circuit.

FIG. 2 shows how this problem can occur in prior art pad driver circuit 5 connected to pad 51 of device 20. Pad driver circuit 5 contains p-channel transistor 6 and n-channel transistor 7, connected as shown. Parasitic diode 8, shown in dotted lines, is not an additional component to the circuit, but represents the physical properties inherent in transistor 6.

When power has been turned off to device 20, Vdd2 is 0. If power is still on at device 10, however, and a logical "1" is present at pad 51, power flows through parasitic diode 8 and causes Vdd2 to rise to a voltage of Vdd1 minus the threshold voltage of parasitic diode 8 (i.e. 5−0.7=4.3V). The existence of a relatively high voltage on Vdd2 can result in device 20 becoming inadvertently powered-on, and/or device 20 inadvertently feeding back power from device 10 through a different data line on communications bus 30.

Figure 3:
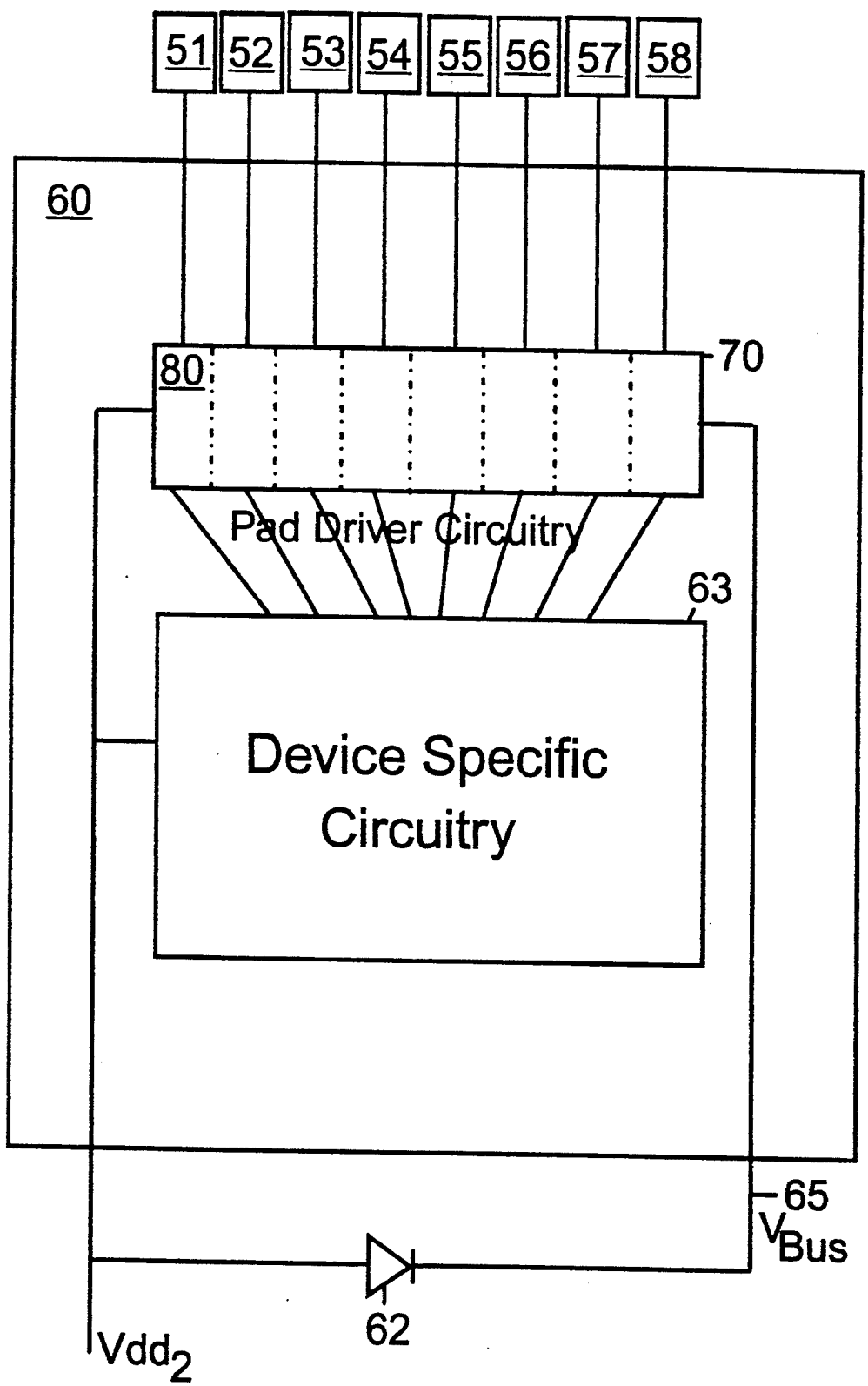
FIG. 3 shows the circuitry in the second electronic device in more detail.

FIG. 3 shows circuitry 60 of the invention in device 20 in more detail. Circuitry 60 contains device specific circuitry 63 and pad driver circuitry 70. Device specific circuitry 63 performs the specific function of device 20 (i.e. print things, make toast, etc.). Diode 62 isolates voltage source Vdd2 from voltage source VBus. Note that device specific circuitry 63 is powered by voltage source Vdd2, while pad driver circuitry 70 is powered by voltage source Vdd2 and voltage source VBus. Pad driver circuitry 70 contains a plurality of identical pad driver circuits 80 corresponding to pads 51-58. Each pad driver circuit 80 is powered by Vdd2 and VBus.

Figure 4:
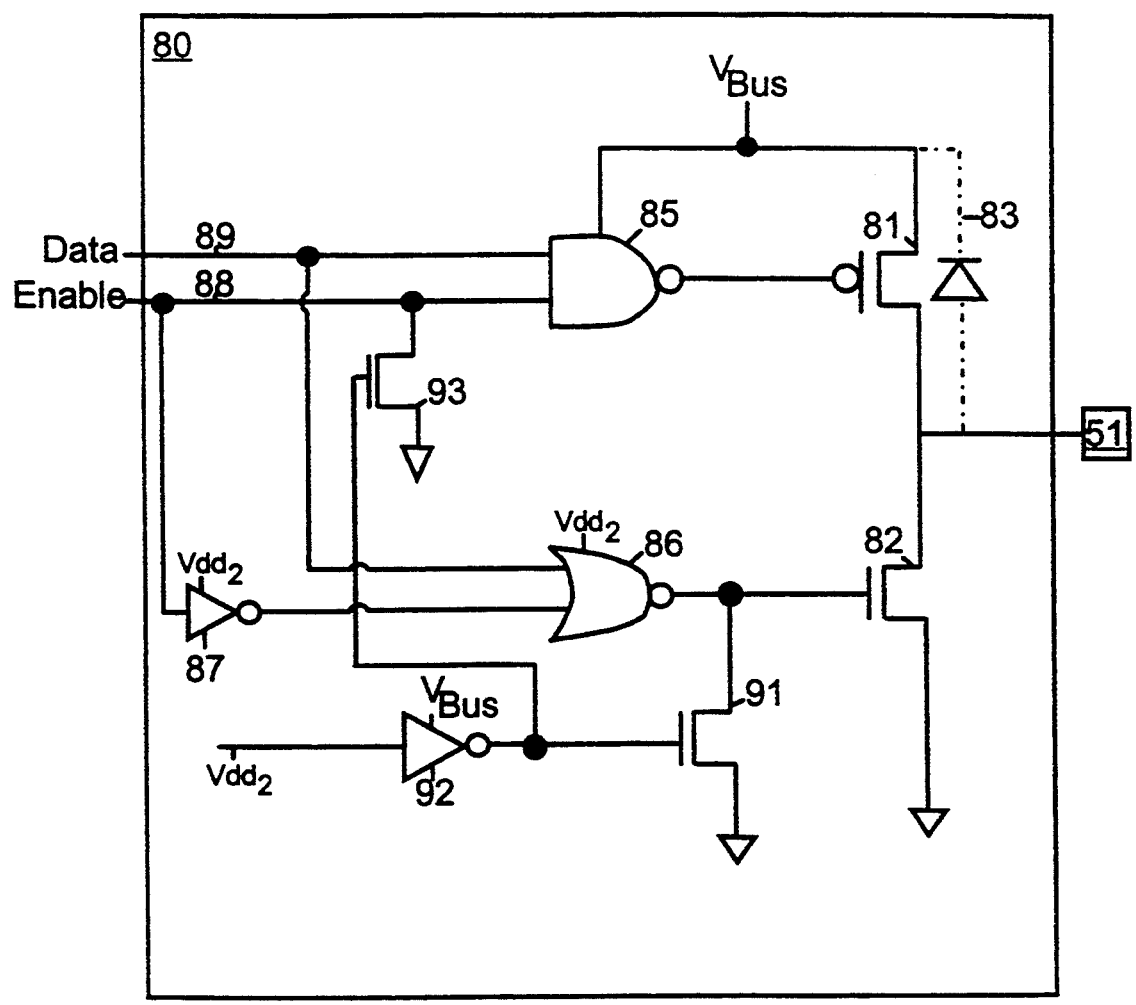
FIG. 4 shows the pad driver circuit with powered down device protection of the invention.

FIG. 4 shows pad driver circuit 80 in more detail. P-channel transistor 81 and n-channel transistor 82 are connected to pad 51 as shown. Parasitic diode 83, inherent in the physical operation of transistor 81 is also shown. Unlike transistor 6 in FIG. 2, the source of transistor 81 of FIG. 4 is not connected to Vddp2, but instead is connected to VBus. NAND gate 85 is connected to the gate of transistor 81 at its output, and to enable line 88 and data line 89 from device specific circuitry 63 at its inputs. NAND gate 85 is powered by VBus. Nor gate 86 is connected to the gate of transistor 82 at its output, and to enable line 88 (through inverter 87) and data line 89 from device specific circuitry 63 at its inputs. Unlike NAND gate 85, NOR gate 86 is powered by Vdd2.

N-channel transistor 91 is connected at its source to the gate of transistor 82 and to the output of NOR gate 86, as shown. Inverter 92 is connected to the gate of transistor 91 at its output, and to Vdd2 at its input. Inverter 92 is powered by VBus. N-channel transistor 93 is connected to enable line 88 at its source, and to the gate of transistor 91 at its gate.

When pad driver circuit 80 detects that device 20 is powered-off (Vdd2=0) and device 10 is powered-on (data at pad 51 is a logical "1"), it assures that device specific circuitry 63 in device 20 will not become inadvertently powered-on by device 10 through communications bus 30. Pad driver circuit 80 further assures that power from device 10 through the data line corresponding to pad 51 on communications bus 30 is not inadvertently fed back to device 10 through a different pad 52-58 corresponding to a different data line on communications bus 30. Pad driver circuit 80 also assures that current from device 10 is not sunk (i.e. finds a path to ground) through pad driver circuit 80.

When a logical "1" is present at pad 51 and when Vdd2=0, pad driver circuit 80 appears to device 20 to be an open circuit, as will now be explained. Voltage from pad 51 powers up VBus through parasitic diode 83. This causes NAND gate 85 to turn on. Since transistor 81 does not have Vdd2 present at its source device 20 will not become inadvertently powered on by device 10 through communications bus 30. Since the data on both enable line 88 and data line 89 is by definition a logical "0" (since it is from powered-down device specific circuitry 62), the inputs at NAND gate 85 are both "0". Therefore, NAND gate 85 essentially acts as an inverter, and the output of NAND gate 85 is a logical "1". This turns transistor 81 off and prevents the voltage present on VBus (Vdd2—threshold voltage of diode 83) from returning to device 10 through another pad 52-58. Since Vdd2=0, NOR gate 86 is off, thereby causing transistor 82 to turn off. This prevents transistor 82 from supplying a discharge path for pad 51, thereby preventing current from device 10 from being sunk by pad driver circuit 80 to ground. Although enable line 88 and data line 89 are both at a logical "0", in practice this can mean a voltage anywhere from 0.0 volts to 0.7 volts can be present on these lines. If a non-zero voltage is present on enable line 88 and/or data line 89, a small amount of current can still be sunk by pad driver circuit 80 through NAND gate 85 and transistor 82. While the amount of current sunk by pad driver circuit 80 is extremely small compared to the circuit of FIG. 2 and is unlikely to cause any damage, it is still desirable in many situations to eliminate it altogether. This is the purpose of transistor 91, inverter 92, and transistor 93 of pad driver circuit 80. When VBus is high, inverter 92 is powered on and provides a logical "1" at its output (since Vdd2=0). This causes transistors 91 and 93 to turn on, thereby providing a discharge path for the small amount of current that may be present on enable line 88 and/or data line 89, and preventing NAND gate 85 and/or transistor 82 from being in a partially on state. While some sinking is still theoretically possible through inverter 92, for all practical purposes this leakage is negligible and can be considered to be non-existent. In the preferred embodiment, leakage on the order of 0.1μA are theoretically possible through inverter 92, an amount those skilled in the art will appreciate can be safely regarded as non-existent.

An alternate embodiment has been contemplated where transistor 91, inverter 92 and transistor 93 are not present in pad driver circuit 80. While the absence of these components means that a small amount of current from device 10 could be sunk by pad driver circuit 80 (i.e. in the order of 2 mA), the remote possibility that actual problems will occur from this small amount of current may not justify the cost of including these components in pad driver circuit 80.

While this invention has been described with respect to the preferred and an alternate embodiment, it will be understood by those skilled in the art that various changes in detail may be made therein without departing from the spirit, scope and teaching of the invention. For example, the circuits shown in the drawings could be replaced by other equivalent circuit structures. Accordingly, the herein disclosed is to be limited only as specified in the following claims.

What is claimed is:

1. A pad driver circuit, connected to a pad for connection between a powered-on first device and a powered-off second device over a data line of a communications bus, said first device powered by a first voltage source, said second device powered by a second voltage source, said driver circuit comprising:

a third voltage source isolated from said second voltage source;

a p-channel transistor connected at its drain to said pad and at its source to said third voltage source;

a first component, connected to the gate of said p-channel transistor at its output, receiving data from device specific circuitry powered by said second voltage source at its input, said first component powered by said third voltage source;

a first n-channel transistor connected at its source to said pad and at its drain to ground; and a second component, connected to the gate of said first n-channel transistor at its output, receiving said data from said device specific circuitry powered by said second voltage source at its input, said first component powered by said second voltage source.

2. The pad driver circuit of claim 1, further comprising:

a second n-channel transistor connected at its source to the gate of said first n-channel transistor and to the output of said second component and at its drain to ground;

a third component connected to the gate of said second n-channel transistor at its output, connected to said second voltage source at its input, said first component powered by said third voltage source; and a third n-channel transistor connected at its source to the input of said first component and at its gate to the gate of said first n-channel transistor, said third n-channel transistor connected at its drain to ground.

3. A second electronic device connected to a first electronic device over a communications bus having a plurality of data lines, said first electronic device powered by a first voltage source, said second electronic device powered by a second voltage source, said second electronic device further comprising:

device specific circuitry powered by said second voltage source;

pad driver circuitry connected to said device specific circuitry, said pad driver circuitry powered by said second voltage source and by a third voltage source isolated from said second voltage source, said pad driver circuitry further comprising:

means for detecting that said first electronic device has been powered-on;

means for detecting that said second electronic device has been powered-off, and means for assuring that said device specific circuitry will not become inadvertently powered-on from said first device through one of said plurality of data lines on said communication bus.

4. The pad driver circuitry of claim 3, further comprising:

means for assuring that power received from said first device will not inadvertently be fed back to said first device on another one of said plurality of data lines on said communications bus.

5. The pad driver circuitry of claim 4, further comprising:

means for assuring that current from said first device will not be sunk through said pad driver circuitry.

6. The second electronic device of claim 3, wherein said second electronic device is a printer.

7. The first electronic device of claim 6, wherein said first electronic device is a computer.

* * * * *